United States Patent
Mizuno et al.

(10) Patent No.: US 7,338,900 B2
(45) Date of Patent: Mar. 4, 2008

(54) METHOD FOR FORMING TUNGSTEN NITRIDE FILM

(75) Inventors: Eiichi Mizuno, Shizuoka (JP); Narishi Gonohe, Shizuoka (JP); Masamichi Harada, Shizuoka (JP); Nobuyuki Kato, Shizuoka (JP)

(73) Assignee: Ulvac Inc., Chigasaki-shi (JP)

( * ) Notice: Subject to any disclaimer, the term of this patent is extended or adjusted under 35 U.S.C. 154(b) by 274 days.

(21) Appl. No.: 11/140,362

(22) Filed: May 31, 2005

(65) Prior Publication Data
US 2005/0221625 A1 Oct. 6, 2005

Related U.S. Application Data

(63) Continuation of application No. PCT/JP03/15776, filed on Dec. 10, 2003.

(30) Foreign Application Priority Data
Dec. 27, 2002 (JP) .............................. 2002-379101

(51) Int. Cl.
*H01L 21/44* (2006.01)
*H01L 21/31* (2006.01)
(52) U.S. Cl. .................. 438/680; 438/681; 438/775; 438/785; 257/E21.168; 257/E21.17
(58) Field of Classification Search ............... 438/680, 438/681, 775, 785
See application file for complete search history.

(56) References Cited

U.S. PATENT DOCUMENTS

| 6,200,893 B1 * | 3/2001 | Sneh .......................... 438/685 |
| 6,872,429 B1 * | 3/2005 | Chen et al. .................. 427/576 |
| 2002/0187631 A1 | 12/2002 | Kim et al. .................. 438/637 |
| 2004/0142557 A1 * | 7/2004 | Levy et al. .................. 438/680 |

FOREIGN PATENT DOCUMENTS

JP 6-89873 3/1994

(Continued)

OTHER PUBLICATIONS

J. K. Klaus et al, Atomically controlled growth to tungsten and tungsten nitride using sequential surface reactions, Applied Surface Science, 2000, vol. 162-163, p. 479-791.
International Search Report dated Mar. 30, 2004.

*Primary Examiner*—Alexander Ghyka
(74) *Attorney, Agent, or Firm*—Kratz, Quintos & Hanson, LLP

(57) ABSTRACT

A method for forming a tungsten nitride film including a first material gas supply step of supplying a first material gas composed of a tungsten compound gas, a reduction step of supplying a reducing gas, a second material gas supply step of supplying a second material gas composed of a tungsten compound gas, and a nitridation step of supplying a nitriding gas. Since a step of depositing tungsten on a substrate 5, and a step of forming tungsten nitride are performed separately, by varying the flow rate of each gas, the pressure when each gas is supplied, and the supply time, or the number of times each step is performed and the order in which the steps are performed, the quantity of tungsten deposited and the quantity of tungsten nitride formed can be controlled easily.

12 Claims, 2 Drawing Sheets

FOREIGN PATENT DOCUMENTS

| | | |
|---|---|---|
| JP | 7-94425 | 4/1995 |
| JP | 7-252660 | 10/1995 |
| JP | 11-54459 | 2/1999 |
| JP | 2000-212749 | 8/2000 |
| JP | 2001-23930 | 1/2001 |
| JP | 2001-319930 | 11/2001 |
| WO | WO 00/54320 | 9/2000 |
| WO | WO 01/99166 | 12/2001 |
| WO | WO 02/48427 | 6/2002 |
| WO | WO 2004/061154 | 7/2004 |

* cited by examiner

METHOD FOR FORMING TUNGSTEN NITRIDE FILM

CROSS-REFERENCE TO RELATED APPLICATION

This application is a U.S. continuation application filed under 35 USC 111(a) claiming benefit under 35 USC 120 and 365(c) of PCT application PCT/JP2003/015776, filed Dec. 10, 2003.

BACKGROUND OF THE INVENTION

1. Field of the Invention

The present invention generally relates to a film formation method, and more particularly to a method for forming a tungsten nitride film for a semiconductor device.

2. Description of the Related Art

In many cases, when forming a thin film using a conventionally known thermal CVD (Chemical Vapor Deposition) method, a gas that acts as a reactant is supplied to a reaction chamber in which a heated substrate has been mounted, and a thermal chemical reaction is caused either in the space inside the chamber or on the substrate surface, thereby depositing a film onto the substrate.

This method is used for forming films of metals (such as, W (tungsten) or Al (aluminum)), or insulation films (such as, $SiO_2$ (silicon dioxide)), which has been used on semiconductor devices to form wiring or interlayer insulation films.

Recently, nitride films (such as, TiN (titanium nitride) or WN (tungsten nitride)) have started to be used as contact layers for use with W, or barrier films for use with Cu wiring. However, with the increasing miniaturization of the structures of semiconductor devices, ever higher levels of performance are being demanded of the thin films formed by CVD methods.

For example, when forming a titanium nitride film, the ability to form the film uniformly on the side walls of contact holes with aspect ratios exceeding 10 is required. With nitride based barrier films, there are other requirements including the ability to form a uniform film with a film thickness of no more than 5 nm on the side walls of via holes, while also maintaining conventional levels of contact resistance. However, it is difficult to form films which satisfy this level of performance using conventional thermal CVD methods.

Furthermore, if Cu wiring is formed on the substrate, then heating the substrate to high temperatures exceeding 350° C. may cause voids in the Cu wiring; and consequently, in order to maintain the reliability of the Cu wiring, film formation is preferably performed under conditions where the substrate temperature is no more than 350° C., and even more preferably no more than 300° C.

Among conventional barrier film formation methods, a method has been proposed in which a material gas (such as, tungsten fluoride gas, a nitriding gas which nitrides the material gas, and a reducing gas which reduces the material gas) are all supplied to the same reaction chamber, thereby forming a barrier film comprising tungsten nitride (W×N). With this method it is possible to form the barrier film under low temperature conditions of no more than 500° C. (For example, see Japanese Patent Laid-Open Publication No. 2001-23930.)

However, this film formation method also requires that the substrate is heated to a temperature of at least 350° C., and when the method is actually applied, film formation is performed with the substrate heated to approximately 380° C., and consequently forming the film while maintaining good reliability of the Cu wiring is problematic.

Furthermore, another method for forming a barrier film comprising a metal nitride, in which film formation is performed by alternately supplying a material gas comprising a metal-containing gas, and a nitriding gas such as ammonia, into a reaction chamber, has also been proposed. (For example, see Japanese Patent Laid-Open Publication No. Hei 11-54459.)

When a tungsten nitride film is formed by this method, the film having a high content of nitrogen and excellent adhesion to silicon substrates can be formed, as in WN and $W_2N$ or the like, but because the high resistance of the film makes the film unsuited to use as a barrier film and further the deposition rate is slow, this method is difficult to apply in practical situations.

In addition, a method in which a barrier film is formed by alternately supplying a material gas comprising a metal-containing gas, and hydrogen gas, to a reaction chamber has also been suggested in the conventional technology. (For example, see Japanese Patent No. 3,415,207 or Japanese Patent Laid-Open Publication No. Hei 6-89873.)

If film formation is performed in accordance with this method, using a tungsten-containing gas, then a film with extremely high tungsten content can be formed at a fast deposition rate. Films with a high tungsten content have excellent adhesion to Cu, as well as low resistance. However, because such films have poor adhesion to $SiO_2$, the films may come off the substrate when formed on a silicon substrate.

Other publications of the conventional technology for the present invention include Japanese Patent Laid-Open Publication No. 2000-212749, Japanese Patent Laid-Open Publication No. 2001-319930, and Japanese Patent Laid-Open Publication No. Hei 7-252660.

The present invention was developed in order to solve the problems with the conventional technology described above, with an object of providing a method for forming a tungsten nitride film which can be applied to barrier film formation and to film formation in contact holes with high aspect ratios.

SUMMARY OF THE INVENTION

In order to resolve the problems described above, a method for forming a tungsten nitride film according to the present invention comprises: a first material gas supply step of supplying a first material gas which has a tungsten compound gas as a main component to a reduced pressure atmosphere where an object to be processed is placed, and then exhausting the first material gas from the reduced pressure atmosphere; a reduction step of supplying a reducing gas which reduces the tungsten compound to the reduced pressure atmosphere, and then exhausting the reducing gas from the reduced pressure atmosphere; a second material gas supply step of supplying a second material gas which has a tungsten compound gas as a main component to the reduced pressure atmosphere, and then exhausting the second material gas from the reduced pressure atmosphere; and a nitridation step of supplying a nitriding gas comprising nitrogen in its chemical structure and which reacts with tungsten to produce tungsten nitride to the reduced pressure atmosphere, and then exhausting the nitriding gas from the reduced pressure atmosphere.

The present invention also provides a method for forming a tungsten nitride film; comprising a tungsten deposition step in which the first material gas supply step and the reduction step are performed in succession, and either one of the first material gas supply step and the reduction step is performed first and the other step is performed second.

The present invention also provides a method for forming a tungsten nitride film; comprising a tungsten nitride formation step in which the nitridation step and the second material gas supply step are performed in succession, and either one of the nitridation step and the second material gas supply step is performed first and the other step is performed second.

The present invention also provides a method for forming a tungsten nitride film; comprising a process that involves a repetition of a tungsten deposition step and a tungsten nitride formation step in a desired proportion, wherein the tungsten deposition step in which the first material gas supply step and the reduction step are performed in succession, and either one of the first material gas supply step and the reduction step is performed first and the other step is performed second. The tungsten nitride formation step in which the second material gas supply step and the nitridation step are performed in succession; and either one of the second material gas supply step and the nitridation step is performed first and the other step is performed second.

The present invention also provides a method for forming a tungsten nitride film, wherein the tungsten deposition step and the tungsten nitride formation step are performed alternately.

The present invention also provides a method for forming a tungsten nitride film, wherein the proportion of tungsten deposition steps performed among the repetitions is increased during the period from the beginning of film formation through to the completion of film formation.

The present invention also provides a method for forming a tungsten nitride film in which a metal or a semiconductor is exposed on at least a portion of the surface of the object to be processed, wherein the tungsten deposition step is performed with the metal or semiconductor in an exposed state.

The present invention also provides a method for forming a tungsten nitride film, wherein the same gas is used for both the first material gas and the second material gas.

The present invention also provides a method for forming a tungsten nitride film, wherein either one, or both of the first material gas and the second material gas comprise tungsten hexafluoride gas.

The present invention also provides a method for forming a tungsten nitride film, wherein monosilane gas is used as the reducing gas.

The present invention also provides a method for forming a tungsten nitride film, wherein ammonia gas is used as the nitriding gas.

The present invention also provides a method for forming a tungsten nitride film, wherein the temperature of the object to be processed is maintained within a range from 200° C. to 350° C. during the first and second material gas supply steps, the reduction step, and the nitridation step.

Furthermore, in the present invention, the reduced pressure atmosphere refers to an atmosphere in which the pressure is lower than that of the atmosphere (atmospheric pressure) outside the device in which the film formation is performed on the object (namely, a vacuum atmosphere).

The present invention is configured in the above manner, and when the first material gas is supplied to the reduced pressure atmosphere where the object to be processed is placed, the first material gas adsorbs to the surface of the object.

After the first material gas has been exhausted from the reduced pressure atmosphere where the object to be processed is placed, the reducing gas is then supplied to the reduced pressure atmosphere, and a reaction occurs between the first material gas adsorbed to the object and the reducing gas, the tungsten compound gas of the first material gas is reduced, and tungsten is deposited onto the surface of the object to be processed (the tungsten deposition step).

Furthermore, when the second material gas is supplied to the reduced pressure atmosphere where the object to be processed is placed, the second material gas is adsorbed onto the object. After the second material gas has been exhausted from the reduced pressure atmosphere, the nitriding gas is supplied, and a reaction occurs on the object between the second material gas and the nitriding gas, thereby forming tungsten nitride (the tungsten nitride formation step).

In those cases where, for example, there is a large difference between the reaction heat required for the reaction to nitride the material gas and the reaction to reduce the material gas, if a plurality of reactive gases (such as, a nitriding gas and a reducing gas) are introduced into the reduced pressure atmosphere at the same time as the material gases, as in conventional thermal CVD methods, the reaction which requires the lowest reaction heat proceeds first; and therefore, it has been difficult to control how much of the tungsten compound gas is reduced and how much of the tungsten compound gas is nitrided.

As described above, in the method for forming a film according to the present invention, the reduction and nitridation of the tungsten compound are carried out separately, and by regulating the flow rate and supply time of the first and second material gases, the reducing gas, and the nitriding gas, it is possible to easily control how much of the tungsten compound is reduced and how much of the tungsten compound is nitrided; and consequently, a tungsten nitride film with the desired composition ratio can be formed.

If the first material gas supply step, the reduction step, the second material gas supply step, and the nitridation step are defined as a single unit film formation step, then in each instance of this unit film formation step, a tungsten nitride film with a film thickness of 10 nm or more can be formed. If, for example, the temperature of the object to be processed is raised, then less of the material gas is adsorbed; and consequently, it is also possible to form a thin film with a film thickness of less than 10 nm by increasing the temperature of the object within the temperature range up to 350° C., reducing the flow rates of the first and second material gases, or shortening the supply time.

If a thick film in excess of 10 nm is desired, then by repeating the unit film formation step, a tungsten nitride film with greater film thickness can be obtained.

Because the deposition of tungsten and the nitridation of tungsten are performed separately in the present invention, even without changing the gas flow rates or supply times, a tungsten nitride film with a high tungsten content can be formed by increasing the proportion of tungsten deposition steps relative to the overall number of steps in the film formation process; and conversely, a tungsten nitride film with a high nitrogen content can be formed by increasing the proportion of tungsten nitridation steps.

Because changing the proportion of tungsten and nitrogen in the tungsten nitride film changes the electrical characteristics and the adhesion of the film, it is possible to obtain a tungsten nitride film well suited to the intended application of the film by varying the number of tungsten deposition steps and tungsten nitride formation steps to suit the material exposed on the film formation surface of the object to be processed, and the required electrical characteristics.

If, for example, the formation of a tungsten nitride film with excellent adhesion to a silicon substrate is desired, then the number of tungsten nitride formation steps should be increased to form a tungsten nitride film with a high nitrogen content. If the formation of a tungsten nitride film with a low sheet resistance is desired, then the number of tungsten deposition steps should be increased to form a tungsten nitride film with a high tungsten content.

When the tungsten deposition step and the tungsten nitride formation step are performed repeatedly, if the ratio of the number of tungsten deposition steps relative to the number of tungsten nitride formations steps is varied during the period from the beginning of film formation through to the completion of film formation, so that the ratio increases more at the time of the completion of film formation than at the time of the beginning of film formation, then the ratio of tungsten to nitrogen on the side of the film that adheres to the object to be processed will be small, whereas conversely, the ratio of tungsten to nitrogen on the side of the film that does not adhere to the object will be large. When the ratio of tungsten relative to nitrogen is low, the film has high adhesion to silicon, and when the ratio of tungsten relative to nitrogen is high, the film has low sheet resistance. Consequently a film can be obtained which combines the two properties of excellent adhesion to the silicon substrate and low sheet resistance.

Figure 1:
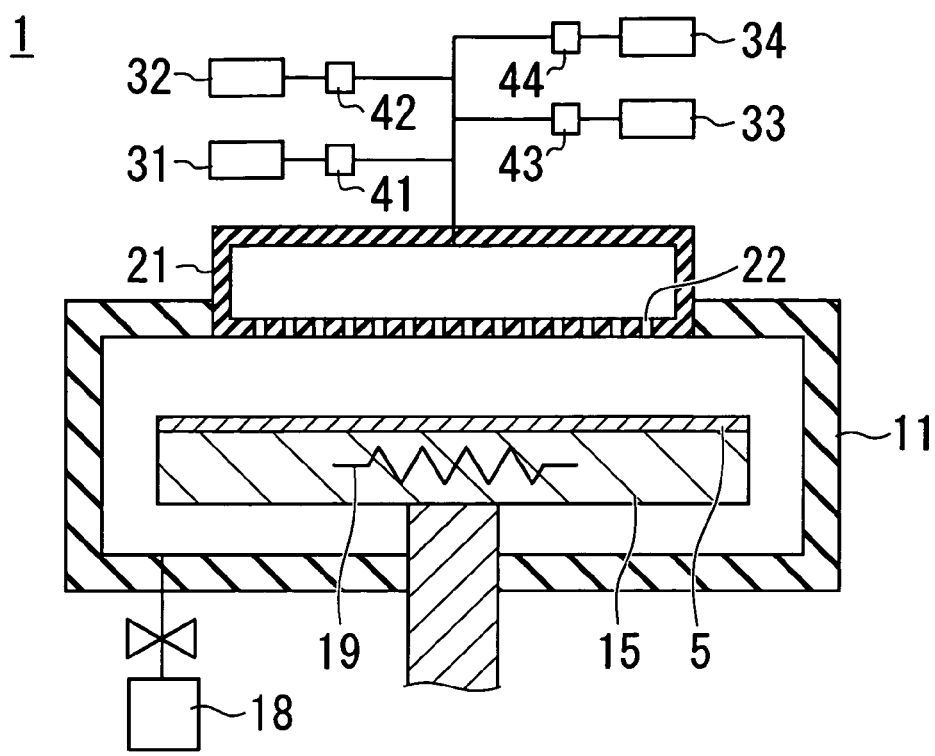
FIG. 1 is a cross-sectional view showing an example of a film forming apparatus used in the present invention.

In the figures, the reference numeral 1 indicates the film forming apparatus. The reference numeral 5 indicates a substrate. The reference numeral 11 indicates a vacuum chamber. The reference numeral 15 indicates a substrate holder. The reference numeral 18 indicates an evacuation system. The reference numeral 19 indicates heating means. The reference numeral 21 indicates a shower head. The reference numeral 22 indicates a gas jet orifice. The reference numerals 31 through 34 indicate gas cylinders. The reference numerals 41 through 44 indicate mass flow controllers.

DETAILED DESCRIPTION OF THE PREFERRED EMBODIMENTS

The following is a description of embodiments of the present invention, with reference to the drawings. The reference numeral 1 in FIG. 1 indicates an example of a film forming apparatus used in the present invention.

This film forming apparatus 1 comprises a vacuum chamber 11, and a shower head 21 is attached to a wall surface of the vacuum chamber 11.

A plurality (four in this case) of gas cylinders 31 through 34 are provided outside the vacuum chamber 11. Each gas cylinder 31 through 34 is connected to the shower head 21 via a mass flow controller 41 through 44 respectively, and the gas with which the gas cylinders 31 through 34 are filled is supplied to the shower head 21, with the flow rate thereof being regulated by the mass flow controllers 41 through 44.

A substrate holder 15 is disposed inside the vacuum chamber 11 in a position opposing the shower head 21 so that when an object to be processed such as a substrate is held by the substrate holder 15, the substrate opposes the shower head 21. Next is a description of the steps involved in forming a tungsten nitride film using this film forming apparatus 1.

First, the substrate is transported to a different processing apparatus from the film forming apparatus 1 described above. In this processing apparatus, once a reduced pressure atmosphere has been formed, a cleaning gas is introduced, a plasma of the cleaning gas is generated, and this plasma is used for cleaning the film formation surface of the substrate (the pretreatment step).

An evacuation system 18 is connected to the vacuum chamber 11 of the film forming apparatus 1 mentioned above. The inside of the vacuum chamber 11 is evacuated by the evacuation system 18 to form a reduced pressure atmosphere inside the vacuum chamber 11 that is of a lower pressure than the atmosphere outside the vacuum chamber 11. The substrate 5, which has already undergone the pretreatment step, is transported from the processing apparatus to the inside of the vacuum chamber 11 while maintaining this reduced pressure atmosphere, thus the substrate is placed in a reduced pressure atmosphere.

Subsequently, while continuing evacuation, the substrate 5 is held on the substrate holder 15, with the film formation surface of the substrate 5 facing the shower head 21. The reference numeral 5 in FIG. 1 indicates the substrate being held by the substrate holder 15.

The heating means 19 is incorporated in the substrate holder 15, and when this heating means 19 is used to raise the temperature of the substrate holder 15, the substrate 5 being held by the substrate holder 15 is heated. The substrate holder 15 has a temperature sensor, not shown in the drawing, which measures the temperature of the substrate 5, and the quantity of current flowing through the heating means is controlled based on the measured temperature, thus the substrate 5 is maintained at a film forming temperature from 200° C. to 350° C.

The gas cylinders 31 through 34 are filled in advance with the tungsten compound gas used as the first and second material gases, the reducing gas, the additive gas, and the nitriding gas, respectively. A plurality of gas jet orifices 22 are provided on the surface of the shower head 21 that faces the substrate 5. When the temperature of the substrate 5 is held within the film forming temperature range mentioned above and the first material gas is jetted from the gas jet orifices 22 of the shower head 21, while evacuation is continued, the first material gas is introduced into the reduced pressure atmosphere where the substrate 5 is placed so that the pressure of the reduced pressure atmosphere rises.

The first material gas is supplied from the gas cylinder 31 to the reduced pressure atmosphere where the substrate 5 is placed for a predetermined period of one second or longer, and a large number of molecules of the tungsten compound of the first material gas adsorb to the film formation surface of the substrate 5 so that a multi-molecular layer of the tungsten compound is formed.

The supply of the first material gas is then stopped while maintaining the evacuation, and by maintaining this state for a predetermined period of time, the first material gas is exhausted from the reduced pressure atmosphere where the substrate 5 is placed, and the pressure of the reduced pressure atmosphere is lowered (the first material gas supply step). At this time, a portion of the tungsten compound desorbs from the multi-molecular layer, but the remainder of the tungsten compound stays adsorbed to the surface of the substrate 5, and consequently, an adsorbed layer of the tungsten compound remains on the surface of the substrate 5 in the form of a multi-molecular layer.

Then, when the temperature of the substrate 5 is maintained at the film forming temperature described above, evacuation is continued, and the reducing gas is supplied to the vacuum chamber 11 from the gas cylinder 32 for a predetermined period of time, thereby raising the pressure of the reduced pressure atmosphere where the substrate 5 is placed, the tungsten compound of the multi-molecular layer is reduced by the reducing gas, and tungsten is deposited.

After supplying the reducing gas for a predetermined period of time, the supply of reducing gas is stopped while maintaining the evacuation, and by maintaining this state for a predetermined period of time, the reducing gas is exhausted from the reduced pressure atmosphere where the substrate 5 is placed, thereby lowering the pressure of the reduced pressure atmosphere, and completing the reduction step.

After the tungsten deposition step, comprising the first material gas supply step and the reduction step, has been completed, a multi-atomic layer comprising a layer of deposited tungsten has been formed on the surface of substrate 5.

When the second material gas, which consists of a tungsten compound gas, is supplied to the vacuum chamber 11 from the gas cylinder 33 for a predetermined time of one second or longer, while the temperature of the substrate 5 is maintained within the film forming temperature range described above and the evacuation is continued, and the pressure of the reduced pressure atmosphere where the substrate 5 is placed is raised, a large number of molecules of the tungsten compound within the second material gas adsorb to the multi-atomic layer formed on the film formation surface of the substrate 5, thereby forming a multi-molecular layer of the tungsten compound.

After supplying the second material gas for a predetermined period of time, the supply of the second material gas is stopped while continuing the evacuation, and by maintaining this state for a predetermined period of time, the second material gas is exhausted from the reduced pressure atmosphere where the substrate 5 is placed, thus lowering the pressure of the reduced pressure atmosphere. Although a portion of the second material gas adsorbed to the substrate 5 desorbs, the remainder of the adsorbed layer stays on the substrate 5 in the form of a multi-molecular layer (the second material gas supply step).

After the second material gas supply step, when the temperature of the substrate 5 is maintained within the film forming temperature range described above and the evacuation is continued, while the nitriding gas is supplied to the vacuum chamber 11 from the gas cylinder 34 for a predetermined period of time, thereby raising the pressure of the reduced pressure atmosphere where the substrate 5 is placed, the tungsten compound of the multi-molecular layer formed on the substrate 5 undergoes nitridation, so that tungsten nitride is generated.

After supplying the nitriding gas for a predetermined period of time, the supply is stopped while continuing the evacuation, and by maintaining this state for a predetermined period of time, the nitriding gas is exhausted from inside the vacuum chamber 11, thereby reducing the pressure of the reduced pressure atmosphere where the substrate 5 is placed, and completing the nitridation step.

Once the tungsten nitride formation step, comprising the second material gas supply step and the nitridation step, has been completed, a film of tungsten nitride has been formed on the substrate 5.

If the combination of the tungsten deposition step and the tungsten nitride formation step is defined as a single unit film formation step, when the formation of a tungsten nitride film with a thicker film thickness than can be deposited in one unit film formation step is required, it is possible to form such a thick tungsten nitride film with a greater film thickness by repeating the unit film formation step.

EXAMPLES

Example 1

A substrate 5 obtained by performing thermal oxidation treatment of a silicon wafer to form silicon dioxide ($SiO_2$) on the surface was transported to the processing apparatus mentioned above and subjected to pretreatment step, and this substrate 5 was then transported to the film forming apparatus 1 described above and subjected to the first material gas supply step, the reduction step, the second material gas supply step, and the nitridation step, in that order, thereby forming a tungsten nitride film.

Here, tungsten hexafluoride gas ($WF_6$) was supplied as the first material gas in the first material gas supply step, monosilane gas ($SiH_4$) was supplied as a reducing gas together with oxygen gas ($O_2$) as an additive gas in the reduction step, the same gas as the first material gas was used as the second material gas in the second material gas supply step, and ammonia gas ($NH_3$) was used as the nitriding gas in the nitridation step.

The conditions for the pretreatment step included ammonia gas ($NH_3$) as the cleaning gas, an input power from the high frequency power source of 300 W, a pressure in the processing apparatus of 13 Pa, and an exposure time of 15 seconds for the object to be exposed to the plasma.

Furthermore, the film formation conditions included a flow rate for the first and second material gases of 5 sccm, a flow rate for the reducing gas of 100 sccm, a flow rate for the additive gas of 2 sccm, and a flow rate for the nitriding gas of 10 sccm, gas supply times and exhaust times in each step of 30 seconds each, a pressure inside the vacuum chamber 11 when each gas was supplied of 1 Pa, and a film forming temperature for the substrate 5 in each step of 250° C. When measured, the film thickness of the deposited tungsten nitride film was 18 nm, and the sheet resistance was approximately 220 ohm/square.

Furthermore, when film formation was performed by repeating the first material gas supply step, the reduction step, the second material gas supply step, and the nitridation step ten times under the same conditions as those in the example 1 described above, but with the exception of altering the exhaust time of the first and second material gases to 90 seconds, a tungsten nitride film was formed with a film thickness of 12 nm. From this finding it is apparent that by extending the exhaust time for the first and second material gases, thereby decreasing the quantity of tungsten compound adsorbed on the substrate 5, a tungsten nitride film with a thinner film thickness can be obtained.

Treating the first material gas supply step, the reduction step, the second material gas supply step, and the nitridation step as one cycle, when film formation was carried out with different numbers of cycles and the sheet resistance of the resulting tungsten nitride film was measured in each case, it was apparent that the number of cycles was proportional to the inverse of the sheet resistance.

Example 2

Using a silicon wafer with holes of diameter 0.2 µm and depth 1 µm formed in one surface as the substrate 5, and using the surface containing the holes as the film formation surface, the pretreatment step and formation of a tungsten nitride film were performed on the film formation surface under the same conditions as those in the example 1.

When measured, the film thickness of the portion of the tungsten nitride film formed on the bottom walls of the holes was approximately 16 nm, and the thickness of the film in those portions of the film formation surface outside the holes (the field) was approximately 18 nm.

When the coverage rate was calculated by dividing the film thickness of the tungsten nitride film within the portions formed on the bottom walls of the holes by the film thickness of the portions formed in the field, and multiplying the result by 100, the coverage rate was high, at approximately 90%, which indicates that the film formation method of the present invention can be favorably applied to the filling of contact holes with high aspect ratios.

Furthermore, from the fact that the film thickness of the portions of the tungsten nitride film formed in the field was approximately the same as the film thickness of the tungsten nitride film formed in the example 1, it can be surmised that the sheet resistance of the tungsten nitride film formed in the example 2 will be approximately the same as the sheet resistance of the tungsten nitride film formed in the example 1.

Furthermore, when film formation was performed while the film forming temperature of the substrate 5 in each of the first material gas supply step, the reduction step, the second material gas supply step, and the nitridation step, was varied within a range from 200° C. to 350° C., a film formation rate that was sufficient for barrier film formation was obtained at film forming temperatures from 200° C. to 350° C.; and the sheet resistance of the produced films was also within an acceptable range for barrier films for use in semiconductor devices.

In this manner, it was confirmed that according to the present invention, even if film formation is performed at temperatures below 350° C., which is lower than in conventional film formation methods, a practically applicable film formation rate was still obtained, and the sheet resistance was also within an acceptable range for use as a barrier film.

<Test Results 1>

A silicon wafer with a titanium nitride (TiN) film formed on the surface was used as the substrate, and this substrate was transported to the processing apparatus described above. Using argon gas as the cleaning gas, a plasma of argon gas was generated for five seconds, thereby cleaning the surface on which the titanium nitride film had been formed (the pretreatment step).

Having undergone the pretreatment step, the substrate was then transported into the vacuum chamber 11 of the film forming apparatus 1, tungsten hexafluoride as the material gas (flow rate of 25 sccm) and argon gas as a dilution gas (flow rate of 1000 sccm) were supplied to the reduced pressure atmosphere where the substrate is placed for 30 seconds, and supply of the material gas was then stopped (the material gas supply step).

After evacuation had been continued for 30 seconds and the material gas had been exhausted, silane gas (50 sccm) as the reducing gas and argon gas (1000 sccm) as a dilution gas were supplied to the vacuum chamber 11 for 30 seconds, thereby reducing the tungsten hexafluoride adsorbed to the substrate in the material gas supply step, and the reducing gas and argon gas inside the vacuum chamber 11 were then exhausted (the reduction step). The pressure of the reduced pressure atmosphere in each step was 100 Pa, and the film forming temperature of the substrate was 300° C.

The tungsten deposition step, comprising the material gas supply step and the reduction step described above, was repeated five times to form a film on the surface of the substrate 5. When measured, the film thickness of the formed film was approximately 80 nm, and when the formed film was analyzed using an AES (Auger Electron Spectroscopy) method, it was apparent that the film was a tungsten film composed of tungsten (W). Furthermore, measurement of the sheet resistance of this tungsten film revealed a result of approximately 2.5 ohm/square.

<Test Results 2>

A substrate identical to that used in the example 1, having undergone cleaning under the same conditions as those in the example 1, was transported to the vacuum chamber 11 of the film forming apparatus 1 described above, and with a tungsten nitride formation step defined as the combination of the second material gas supply step and the nitridation step, performed once each in that order, this tungsten nitride formation step was repeated 10 times, thereby forming a film on the substrate surface. Here, the conditions of the tungsten nitride formation step were the same as those in the example 1.

When the film formed on the substrate surface was analyzed using the AES method, it was confirmed that the film was a tungsten nitride film composed of $W_2N$. When measured, the film thickness of the tungsten nitride film was approximately 30 nm, and the sheet resistance was approximately 100,000 ohm/square.

From the test results 1 and 2 described above, it can be surmised that the composition ratio of W to N in the tungsten nitride films formed in examples 1 and 2 is from 4:1 to 5:1, and from the sheet resistance values in the test results 1 and 2 and examples 1 and 2, it is apparent that the greater the tungsten content, the lower the sheet resistance.

As described above, in the invention of the present application, the first material gas supply step, the reduction step, the second material gas supply step, and the nitridation step are performed separately, and by adjusting the flow rates of the first and second material gases, or the film forming temperature of the substrate, it is possible to control the quantity of the tungsten compound gas which adsorbs to the substrate in each material gas supply step, and control the quantity of tungsten reduced and the quantity of tungsten nitrided in the reduction step and the nitridation step respectively, which follow the material gas supply steps. Consequently, according to the present invention, a tungsten nitride film with a desired composition ratio can be obtained.

Furthermore, from the fact that in the test result 1, which involved repeating only the tungsten deposition step, a tungsten film was formed, whereas in the test result 2, which involved repeating only the tungsten nitride formation step, a $W_2N$ film was formed, it would seem likely that in the example 1 and the example 2, in which adsorption and reduction of the tungsten compound gas, and adsorption and nitridation of the tungsten compound gas were performed separately, the formed tungsten nitride film should have a layered construction comprising a layer formed solely of tungsten, and a layer of tungsten nitride.

It is known that tungsten has poor adhesion to silicon oxide films as described above, and therefore if a layer formed solely of tungsten is formed on a silicon oxide film, the film should come off the substrate extremely easily.

However, as with tungsten nitride films formed using conventional thermal CVD methods, the tungsten nitride films obtained in the example 1 and the example 2 do not come off easily the substrate 5, and from the sheet resistance values of these films, it can be surmised that the tungsten nitride films of the example 1 and the example 2 of the present invention do not have a layered configuration of tungsten and tungsten nitride, but rather have the tungsten and nitrogen distributed evenly throughout the films.

In the description above, the first and second material gases both contained the same tungsten compound gas, but the present invention is not limited to this case, and the first and second material gases may each comprise a different tungsten compound gas.

As the first and second material gases, in addition to tungsten halide gases (such as, tungsten hexafluoride or tungsten hexachloride ($WCl_6$)), various types of tungsten compound gases including tungsten oxyhalide gases (such as, $WOF_2$, $WOF_4$, $WOCl_2$ and $WOCl_4$), organometallic compound gases (such as, $W(OC_2H_5)_5$ and $W(OC_2H_5)_6$), and tungsten carbonyl gases (such as, $W(CO)_5$ and $W(CO)_6$), may be used.

Furthermore, the first and second material gases may either comprise a single tungsten compound gas, or may comprise a mixture of two or more different tungsten compound gases.

The first and second material gas supply steps are not limited to the supply of only the first and second material gases to the vacuum chamber 11, and if a diluting gas (such as, argon gas) is supplied together with the first or second material gas, then the quantity of the gas which adsorbs to the substrate can be controlled by the dilution of the first or second material gas by the diluting gas.

Similarly, when supplying the reducing gas or the nitriding gas, it is possible to supply a diluting gas (such as, argon gas) at the same time, thereby controlling the reducing gas concentration or the nitriding gas concentration.

Furthermore, as described in the example 1 above, supplying oxygen gas as an additive gas together with the reducing gas has the effect of improving the adhesion between the deposited tungsten and the substrate. Hence, in order to improve the performance of the tungsten nitride, the properties of the tungsten nitride film can be controlled by supplying an appropriate additive gas that suits the purpose of the film at the same time as the supply of the first and second material gas, the reducing gas, and the nitriding gas respectively.

The reducing gas is not limited to monosilane gas, and gases (such as, disilane gas ($Si_2H_6$) or dichlorosilane gas ($SiH_2Cl_2$)) can also be used, provided that the reducing gas can reduce the tungsten compound used in the first material gas.

The nitriding gas is not limited to ammonia gas, and gases (such as, hydrazine gas ($N_2H_4$) or a hydrazine derivative gas) in which a hydrogen within the hydrazine has been substituted with a CxHy group (wherein, x and y represent arbitrary integers) may be used, provided that the nitriding gas can cause the tungsten compound used in the second material gas to undergo nitridation.

Similarly, the type of cleaning gas used in the pretreatment step is not limited to ammonia gas, and a variety of gases (such as, argon gas) may be chosen depending on the intended purpose. Furthermore, if a rotational shaft is provided on the substrate holder 15 and the substrate 5 is rotated within the horizontal plane by the rotational shaft during the first and second material gas supply steps, the reduction step and the nitridation step, then a tungsten nitride film with a uniform film thickness can be formed on the surface of the substrate 5.

There are no particular restrictions on the ultimate pressure when supplying each gas, and this can be set within a range from $10^{-2}$ Pa (inclusive) to $10^2$ Pa (exclusive), although preferably to a value equal to or less than several Pa, depending on the purpose of the film formation.

In the description above, the temperature of the substrate 5 was set to the same film forming temperature in each of the first and second material gas supply steps, the reduction step, and the nitridation step, but the present invention is not limited to this case, and the temperature of the substrate 5 in each step may be changed within the temperature range from 200° C. to 350° C.

In the description above, the first and second material gas supply steps, the reduction step, and the nitridation step were each performed in the same film forming apparatus 1, but the first and second material gas supply steps, the reduction step and the nitridation step may also be performed in separate film forming apparatuses.

Treating the first material gas supply step, the reduction step, the second material gas supply step, and the nitridation step as one cycle, if film formation is performed over multiple cycles, the same gas may be used as the first and second material gases, reducing gas, and nitriding gas in each cycle, or alternatively, the types of gas used as the first and second material gases, the reducing gas, and the nitriding gas may be changed in each cycle.

In the description of the tungsten deposition step above, the reduction step was performed after the first material gas supply step, but the present invention is not limited to this case, and the tungsten may also be deposited by first adsorbing the reducing gas to the substrate 5 in the reduction step, and subsequently supplying the first material gas to the vacuum chamber 11 in the first material gas supply step, thus causing contact between the reducing gas adsorbed to the substrate 5, and the first material gas.

The number of first material gas supply steps in a single tungsten deposition step need not necessarily be the same as the number of reduction steps. For example, the tungsten deposition step covers both cases where a reduction step, a first material gas supply step, and a reduction step are performed in succession in that order and where a first material gas supply step, a reduction step, and a first material gas supply step are performed in succession in that order.

Furthermore, the tungsten nitride formation step is not limited to performing the nitridation step after the second material gas supply step, and the tungsten nitride may also be formed by first adsorbing the nitriding gas to the substrate in the nitridation step, and subsequently supplying the second material gas to the vacuum chamber 11 in the second material gas supply step, thus causing contact between the nitriding gas adsorbed to the substrate 5, and the second material gas.

The number of second material gas supply steps in a single tungsten nitride formation step need not necessarily be the same as the number of reduction steps. For example, the tungsten nitride formation step covers both cases where a nitridation step, a second material gas supply step, and a nitridation step are performed in succession in that order and where a second material gas supply step, a nitridation step, and a second material gas supply step are performed in succession in that order.

In the description above, the tungsten deposition step was performed first, followed by the tungsten nitride formation step, but the present invention is not limited to this case. The tungsten nitride formation step may also be performed first, when starting the film formation process, thus forming a tungsten nitride film on the substrate, and subsequently the tungsten deposition process may be used to deposit the tungsten on the tungsten nitride.

In short, the present invention enables the production of a tungsten nitride film containing a desired ratio of nitrogen and tungsten, by enabling the selection of the number and the order of the tungsten deposition steps and the tungsten nitride formation steps, the number and the order of the first material gas supply steps and the reduction steps which constitute the tungsten deposition step, and the number and the order of the second material steps and the nitridation steps which constitute the tungsten nitride formation step.

In the description above, the case was described in which the supply of all gases, including the first and second material gases, the reducing gas, and the nitriding gas, was stopped and a reduced pressure atmosphere was formed, but the present invention is not limited to this case; and in an alternative case, once the supply of the first and second material gases, the reducing gas, and the nitriding gas has been stopped, a purge gas is supplied to the vacuum chamber 11 while evacuation is continued, and this purge gas can be used to flush the gas from inside the vacuum chamber 11. There are no particular restrictions on the type of purge gas used in the present invention, but a gas which does not react with the first and second material gases, the reducing gas, the nitriding gas, or the semiconductor or metal exposed on the surface of the object to be processed is preferred, and suitable gases include inert gases (such as, nitrogen, argon, and helium or the like).

Furthermore, when the first and second material gases, the reducing gas, and the nitriding gas are supplied to the vacuum chamber 11, the purge gas described above can also be supplied to the vacuum chamber 11 together with these gases as a dilution gas. In this case, when the supply of the first and second material gases, the reducing gas, and the nitriding gas is stopped, there is no need to also stop the supply of the purge gas.

Example 2-1

A tungsten nitride film was formed under the same conditions as those in the example 1 above, with the exception that the supply times of the first and second material gases were both changed to 2.5 seconds. The film thickness of the tungsten nitride film formed in the example 2-1 was approximately half that of the tungsten nitride film formed in the example 1.

Example 2-2

A film was formed under the same conditions as those in the example 1 above, with the exception that the supply times of the first and second material gases were both changed to 1 second. The sheet resistance of the tungsten nitride film formed in the example 2-2 was approximately 10 times as high as that of the tungsten nitride film formed in the example 1.

From these facts, it is apparent that by varying the supply time of the first and second material gases and controlling the quantity of the material gases that adsorb to the substrate 5, a tungsten nitride film with the desired film thickness and the desired sheet resistance can be obtained.

Example 3

Defining a first unit film formation step as the performance of the tungsten deposition step and the tungsten nitride formation step, once each in that order, a substrate 5 was subjected to pretreatment under the same conditions as those in the example 1, and the first unit film formation step was then performed 10 times to form a tungsten nitride film. Here, the same types of gas as those in the example 1 were used in the first and second material gas supply steps and the nitridation step, and both the supply time and exhaust time of each gas in the first and second material gas supply steps and the nitridation step, and the flow rate for each gas, were the same as those in the example 1. No additive gas was used in the reduction step, with only monosilane gas being used. Furthermore, the supply time and exhaust time of the gas in the reduction step were the same as those in the example 1.

In the tungsten deposition step, the first material gas supply step and the reduction step were performed once each, in that order; and in the tungsten nitride formation step, the second material gas supply step and the nitridation step were performed once each, in that order. Furthermore, in this example, the temperature of the substrate 5 from the beginning through to the completion of film formation was 270° C., the film forming pressure was such that the pressure inside the vacuum chamber 11 when each gas was supplied was in a range from $5 \times 10^{-2}$ Pa to 0.1 Pa, and the pressure inside the vacuum chamber 11 when each gas was exhausted was less than the film forming pressure.

The film thickness of the tungsten nitride film formed in the example 3 was 135 nm, and the resistivity was 280 μΩcm.

Next, this tungsten nitride film was analyzed using the AES method, and the relationship between the depth from the film surface and the variation in the atomic concentration of each type of atom was determined. The results are shown in FIG. 2.

Figure 2:
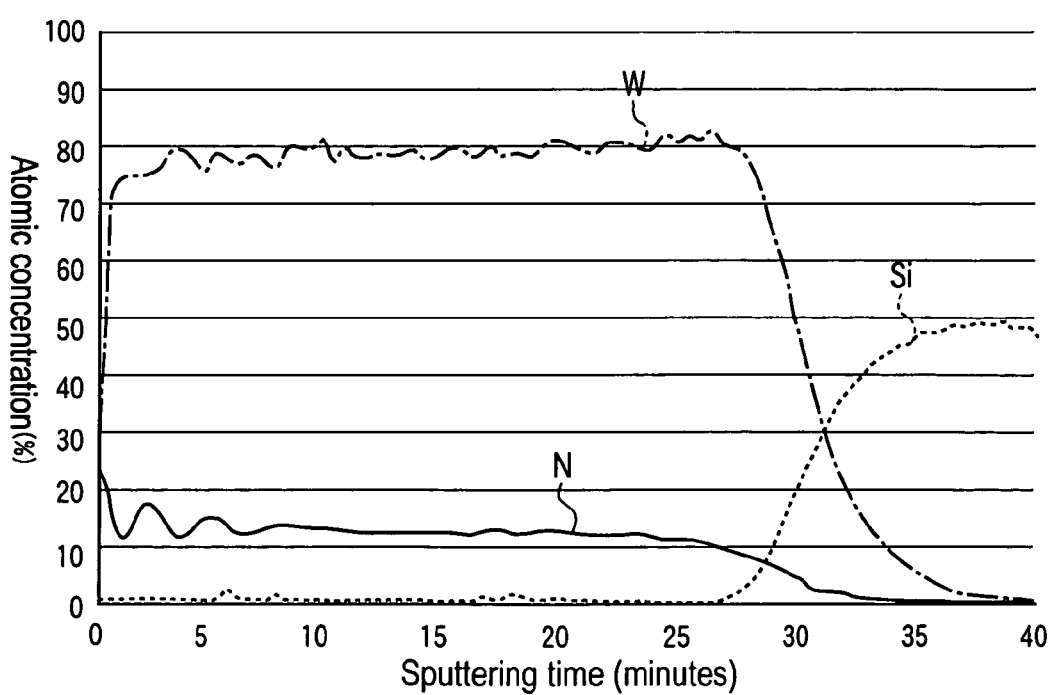
FIG. 2 is a graph showing the relationship between the depth from the film surface of the tungsten nitride film and the atomic concentration of each type of atom in example 3.

The vertical axis in FIG. 2 indicates the atomic concentration (%) of each atom, and the horizontal axis indicates the sputtering time (minutes); and hence, the longer the sputtering time, the deeper the depth from the film surface.

It is apparent from FIG. 2 that the ratio of the atomic concentrations of W and N in this tungsten nitride film was approximately 6:1.

When a tungsten nitride film is formed by a conventional method, which the tungsten compound gas, the reducing gas, and the nitriding gas are supplied to the vacuum chamber 11 all at once, the ratio of the atomic concentrations of W and N will be either 1:1 or 1:2, but when the first and second material gases, the reducing gas, and the nitriding gas are supplied to the vacuum chamber 11 separately, as in the example 3, it is clear that a tungsten nitride film can be obtained which has a higher tungsten concentration than films obtained by conventional methods.

Furthermore, from the surface of the tungsten nitride film, down until the depth where the Si of the silicon substrate was detected, at a point where the sputtering time exceeded 25 minutes, the ratio of the atomic concentrations of W and N was substantially constant. From this finding it is apparent that from the beginning through to the completion of the film formation process, when the unit film formation step is repeated without changing the proportion of the tungsten deposition steps and tungsten nitride formation steps which constitute the unit film formation step, a tungsten nitride film is formed which has a constant atomic concentration ratio in the depth direction.

Example 4

After subjecting the substrate 5 to pretreatment under the same conditions as the example 1 above, the first unit film formation step described above was repeated 50 times, thus forming a tungsten nitride film. The temperature of the substrate 5 was 300° C. from the beginning through to the completion of the film formation, and the supply time and exhaust time were 15 seconds for each gas. Furthermore, the same types of gases were used in each step as those in the example 3, the flow rates were also the same as the example 3, and the pressure (when each gas was supplied) and the pressure (when each gas was exhausted) were also the same as those in the example 3. In the tungsten deposition step, the first material gas supply step and the reduction step were performed once each, in that order, and in the tungsten nitride formation step, the second material gas supply step and the nitridation step were performed once each, in that order.

The film thickness of the tungsten nitride film formed in the example 4 was 28.7 nm, and the resistivity was 675 $\mu\Omega$cm.

Example 5

A second unit film formation step was defined as repeating the tungsten deposition step twice. A third unit film formation step was defined as repeating the first unit film formation step described above six times and then repeating the second unit film formation step four times, and after subjecting a substrate 5 to pretreatment under the same conditions as those in the example 1 above, this third unit film formation step was repeated five times to form a tungsten nitride film.

The conditions, including the type of gas used in each step, the flow rate of each gas, the pressure during supply of each gas, the pressure when each gas was exhausted, the temperature of the substrate 5 from the beginning through to the completion of film formation, and the supply time and exhaust time for each gas, were all the same as those in the example 4. Here, in the tungsten deposition step, the first material gas supply step and the reduction step were performed once each, in that order, and in the tungsten nitride formation step, the second material gas supply step and the nitridation step were performed once each, in that order.

Because a larger quantity of tungsten was deposited when forming the tungsten nitride film in this example 5, the film, at 32 nm, was thicker than in the example 4. Furthermore, the resistivity of the tungsten nitride film of the example 5, at 326 $\mu\Omega$cm, was lower than in the example 4.

The tungsten nitride films formed in the example 4 and the example 5 were analyzed using the AES method, and the depth from the film surface and the atomic concentration of each type of atom were determined. The results are shown in FIG. 3 and FIG. 4.

Figure 3:
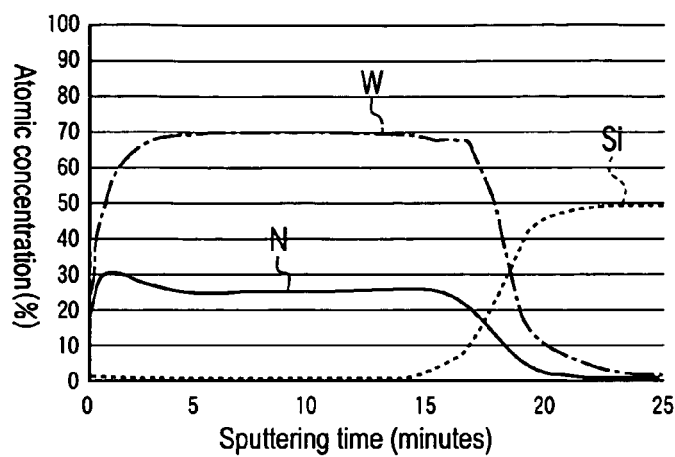
FIG. 3 is a graph showing the relationship between the depth from the film surface of the tungsten nitride film and the atomic concentration of each type of atom in example 4.
Figure 4:
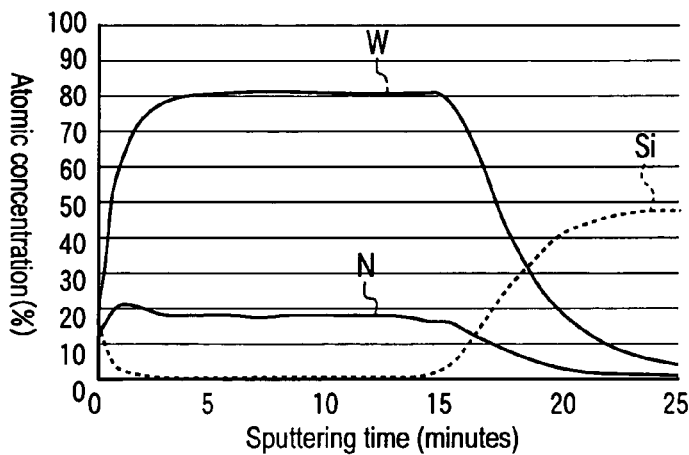
FIG. 4 is a graph showing the relationship between the depth from the film surface of the tungsten nitride film and the atomic concentration of each type of atom in example 5.

A comparison of FIG. 3 and FIG. 4 reveals that the ratio of tungsten to nitrogen in the tungsten nitride film formed in the example 5 is higher than in the example 4, and that by increasing the proportion of tungsten deposition steps, a tungsten nitride film is formed which has a high tungsten to nitrogen (W/N) ratio.

Example 6

After subjecting a substrate 5 to pretreatment under the same conditions as those in the example 1 above, the first unit film formation step described above was repeated 46 times, and then the second unit film formation step was repeated 8 times, thus forming a tungsten nitride film.

In each step, the same type of gas was used as in the examples 3 through 5.

In each unit film formation step, the flow rate of the first and second material gases ($WF_6$) was 5 sccm, the supply time of the first and second material gases was 5 seconds, the exhaust time of the first and second material gases was 2 seconds, the flow rate of the reducing gas ($SiH_4$) was 50 sccm, the supply time of the reducing gas was 10 seconds, the exhaust time of the reducing gas was 10 seconds, the flow rate of the nitriding gas ($NH_3$) was 11 sccm, the supply time of the nitriding gas was 2 seconds, and the exhaust time of the nitriding gas was 10 seconds. Furthermore, the same conditions as those in the example 4 and the example 5 were used for the pressure during supply of each gas, the pressure when each gas was exhausted, and the temperature of the substrate 5 from the beginning through to the completion of film formation. Here, in the tungsten deposition step, the first material gas supply step and the reduction step were performed once each, in that order, and in the tungsten nitride formation step, the second material gas supply step and the nitridation step were performed once each, in that order.

The film thickness of the tungsten nitride film formed in the example 6, at 37.3 nm, was slightly thicker than in the example 4 and the example 5. Furthermore, the resistivity was 284 $\mu\Omega$cm, which is lower than in the example 4 and the example 5.

The tungsten nitride film thus formed was analyzed using the AES method, and the depth from the film surface and the variation in the atomic concentration of each type of atom were determined. The results are shown in FIG. 5.

Figure 5:
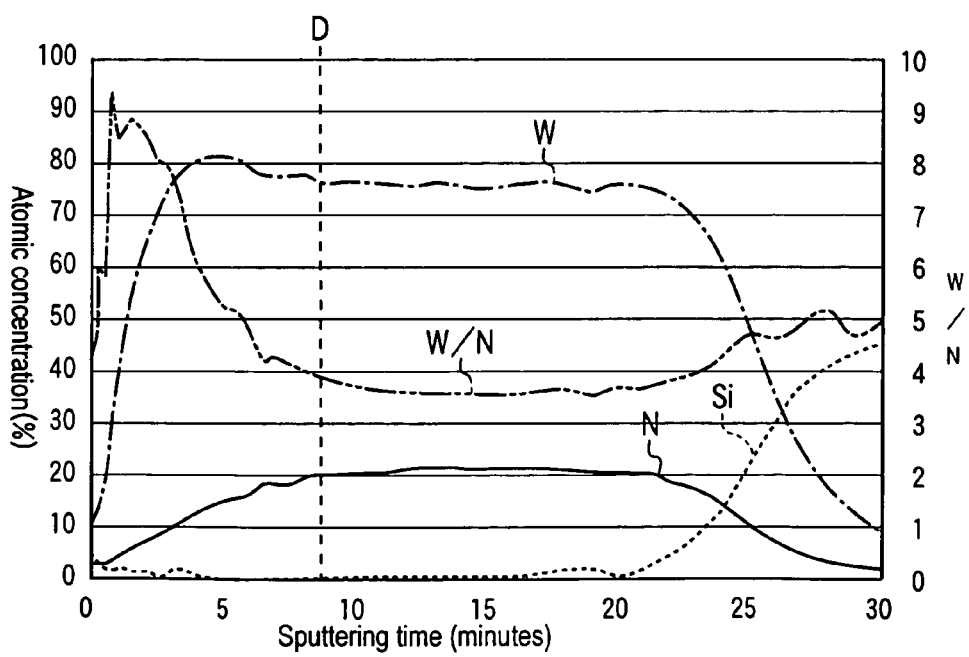
FIG. 5 is a graph showing the relationship between the depth from the film surface of the tungsten nitride film and the atomic concentration of each type of atom in example 6.

It is apparent from FIG. 5 that in the tungsten nitride film formed in the example 6, the tungsten and nitrogen content ratio W/N was high near the surface of the film, but gradually became lower as the depth increased. Label D in FIG. 5 indicates a depth corresponding to approximately 8 minutes of sputtering time; and from this depth D, the nitrogen concentration was substantially constant.

From these findings, it is apparent that in the example 6, a film with a low W/N ratio was formed from the beginning of the film formation process until the film thickness corresponding to the depth D was reached, whereas from this film thickness until the completion of the film formation process, a film with a high W/N ratio was formed.

It is known that the higher the W/N ratio, the lower the resistivity of a tungsten nitride film; and conversely, the lower the W/N ratio, the higher the adhesion to the silicon substrate. Consequently, it is apparent that the tungsten nitride film formed in the example 6 has dual characteristics in that the side which adheres to the object to be processed has high adhesion, whereas the opposite side from the object has low resistivity.

According to the film formation method of the present invention, it is possible to form a tungsten nitride film with a desired composition ratio of N and W, and by forming a film with the desired composition ratio of N to W, it is possible to control the sheet resistance value of the tungsten nitride film. Furthermore, according to the film formation method of the present invention, it is possible to fill microscopic contact holes. In the present invention, because a multi-molecular layer of a tungsten compound is formed in one material gas supply step, if the combination of one first material gas supply step, one reduction step, one second material gas supply step, and one nitridation step is defined as one unit film formation step, then in one unit film formation step, a tungsten nitride film with a film thickness of 10 nm or more can be formed. Accordingly, the film formation efficiency is better than in an ALD method which forms a single atomic layer in one unit film formation step; and as a result, the time required for film formation can be reduced.

What is claimed is:

1. A method for forming a tungsten nitride film on a surface of an object to be processed, comprising:
    a tungsten deposition step having a first material gas supply step and a reduction step,
    wherein the first material gas supply step of supplying a first material gas includes a tungsten compound gas as a main component into a reduced pressure chamber, wherein the object to be processed is placed, and then exhausting the first material gas from the reduced pressure chamber,
    wherein the reduction step of supplying a reducing gas reduces the tungsten compound to the reduced pressure chamber, and then exhausting the reducing gas from the reduced pressure chamber, and
    wherein one of the first material gas and the reducing gas is supplied firstly, and molecules of the gas supplied first are deposited on the surface of the object, and after exhausting the gas supplied firstly, another gas is supplied secondly, and the gas supplied secondly reacts with the molecules of the gas supplied firstly on the object, metallic tungsten layer is formed on the object;
    a tungsten nitride formation step having a second material gas supply step and a nitridation step,
    wherein the second material gas supply step of supplying a second material gas which includes a tungsten compound gas as a main component into the reduced pressure chamber, and then exhausting the second material gas from the reduced pressure chamber; and
    the nitridation step of supplying a nitriding gas having nitrogen in its chemical structure and which reacts with tungsten to produce tungsten nitride to the reduced pressure chamber, and then exhausting the nitriding gas from the reduced pressure chamber,
    wherein one of the second material gas and the nitriding gas is supplied firstly, and molecules of a gas supplied firstly are deposited on the surface of the object, and after exhausting the gas supplied firstly, another gas is supplied secondly, and the gas supplied secondly reacts with the molecules of the gas supplied firstly on the object and tungsten nitride layer is formed on the object, and
    wherein the tungsten deposition step and the tungsten nitride formation step are repeated in a desired proportion.

2. The method for forming a tungsten nitride film according to claim 1, further comprising the tungsten deposition step in which the first material gas supply step and the reduction step are performed in succession, and either one of the first material gas supply step and the reduction step is performed first and the other step is performed second.

3. The method for forming a tungsten nitride film according to claim 1, further comprising the tungsten nitride formation step in which the nitridation step and the second material gas supply step are performed in succession, and either one of the nitridation step and the second material gas supply step is performed first and the other step is performed second.

4. The method for forming a tungsten nitride film according to claim 1, wherein the tungsten deposition step and the tungsten nitride formation step are performed alternately.

5. The method for forming a tungsten nitride film according to claim 1, wherein the proportion of the tungsten deposition steps performed among the repetition is increased during the period from the beginning of film formation through to the completion of film formation.

6. The method for forming a tungsten nitride film according to claim 1, wherein a metal or a semiconductor is exposed on at least a portion of the surface of the object to be processed, wherein the tungsten deposition step is performed with the metal or semiconductor in an exposed state.

7. The method for forming a tungsten nitride film according to claim 1, wherein the same gas is used for both the first material gas and the second material gas.

8. The method for forming a tungsten nitride film according to claim 1, wherein either one, or both of the first material gas and the second material gas comprise tungsten hexafluoride gas.

9. The method for forming a tungsten nitride film according to claim 1, wherein monosilane gas is used as the reducing gas.

10. The method for forming a tungsten nitride film according to claim 1, wherein ammonia gas is used as the nitriding gas.

11. The method for forming a tungsten nitride film according to claim 1, wherein the temperature of the object to be processed is maintained within a range from 200° C. to 350° C. during the first and second material gas supply steps, the reduction step, and the nitridation step.

12. The method for forming a tungsten nitride film according to claim 1, wherein the tungsten compound gas of the first material gas is the same as the tungsten compound gas of the second material gas.

* * * * *